United States Patent
Salokatve et al.

[11] Patent Number: 6,053,981
[45] Date of Patent: Apr. 25, 2000

[54] EFFUSION CELL AND METHOD OF USE IN MOLECULAR BEAM EPITAXY

[75] Inventors: Arto K. Salokatve, Tampere, Finland; David C. Poole, Horsham, United Kingdom

[73] Assignees: Coherent, Inc.; VG Systems Limited, Santa Clara, Calif.

[21] Appl. No.: 09/153,706

[22] Filed: Sep. 15, 1998

[51] Int. Cl.$^7$ .................................................. C23C 14/00
[52] U.S. Cl. ............................................................ 118/726
[58] Field of Search .............................................. 118/726

[56] References Cited

U.S. PATENT DOCUMENTS

| | | | |
|---|---|---|---|
| 4,646,680 | 3/1987 | Maki | 118/726 |
| 5,616,180 | 4/1997 | Lee et al. | 118/715 |

FOREIGN PATENT DOCUMENTS

| | | |
|---|---|---|
| 05085888 | 9/1991 | Japan. |
| WO 97/06292 | 8/1996 | WIPO. |

*Primary Examiner*—Richard Bueker
*Attorney, Agent, or Firm*—Limbach & Limbach L.L.P.

[57] ABSTRACT

An effusion cell (22) including a crucible (28) is configured such that when attached to the MBE apparatus at a predetermined distance from a rotatable substrate holder (24), a longitudinal axis (32) of the crucible is directed toward the substrate holder at an angle to the rotation axis (26) of the substrate holder. The crucible is heatable for melting a material (36) placed therein, the molten material forming a melt surface (38) from which molecules of the material are evaporated. The top of the crucible has an elliptical opening (31), the plane of which is parallel to the substrate holder. The crucible and the opening therein are configured such that a substrate (25) in the substrate holder receives only evaporated molecules which proceed directly thereto from the melt surface, through the opening. The evaporated molecules received by the substrate are contributed from an area of the melt surface which increases in proportion to the square of the distance of the melt surface from the substrate holder, as that distance increases due to depletion of the material in the crucible by evaporation. This provides that molecular flux on the substrate remains constant during the depletion.

20 Claims, 9 Drawing Sheets

EFFUSION CELL AND METHOD OF USE IN MOLECULAR BEAM EPITAXY

TECHNICAL FIELD OF THE INVENTION

The present invention relates generally to deposition of layers by molecular beam epitaxy (MBE). It relates in particular to an arrangement of an effusion cell with respect to a rotating substrate holder in MBE apparatus, the cell being arranged to provide a uniform layer thickness on a substrate, essentially independent of the level of material in the cell.

DISCUSSION OF BACKGROUND ART

MBE is a useful method for growing multilayer semiconductor devices such as infrared detectors, diode-lasers and the like. As layers of material for such devices are typically grown from high purity elemental components of the material, and are typically grown under ultra high vacuum conditions, for example $10^{-8}$ Torr or less, layer composition may be controlled with high precision. Components of layer material are evaporated from effusion cells which are preferably arranged as isothermal enclosures for material to be melted and evaporated. Layer thickness is controlled by timed deposition at a predetermined flux of evaporated material. The flux is determined, among other factors, by the temperature of the effusion cell.

While favored as a method for development and investigation of experimental and prototype devices MBE has hitherto been considered at least second to metalorganic chemical vapor deposition (MOCVD) as a method of choice for manufacturing quantities of devices. This method, however, while able to provide high growth rates an good layer uniformity, requires the use of highly-toxic, metalorganic precursor materials. This, in turn, requires that extensive safety measures must be provided to protect operators of such MOCVD equipment, and indeed anyone in or around a facility in which it is housed.

It is widely perceived that MBE offers only slow growth rate, is unable to deposit uniform layers over a relatively large area, and requires frequent recharging of cells and maintenance of sophisticated vacuum equipment. This perception is not entirely correct, as MBE apparatus is available including high capacity effusion cells, which can be arranged to deposit relatively uniform layers on a substrate rotated constantly during layer deposition. Capacity of cells is such that they can be used for periods of weeks, or even months, without recharging, allowing a deposition chamber to be maintained under vacuum for that period of time. Substrates are inserted into and removed from the deposition chamber via a vacuum load lock. Typically, however, in these high capacity cells thickness uniformity of growth has been limited to about ±2%, and varies significantly as the level of material in the cell is depleted. Flux from such cells as a function of cell temperature also varies with material depletion, requiring that the flux must be remeasured, if not during a device deposition cycle, certainly from one deposition cycle to the next. This can be a particular problem when depositing devices such as vertical cavity surface emitting semiconductor lasers which may include up to a hundred, or even more, individual layers of precisely controlled thickness.

Attempts have been made to improve uniformity and variation of flux distribution with depletion by the use of internal baffles in a cell to shape the flux distribution. The use of baffles however provides for multiple paths by which molecules leaving the surface of molten material may reach a substrate. Molecules which do not proceed directly from the melt surface to the substrate can arrive, indirectly, at the substrate after being reflected or adsorbed and re-emitted one or more times from such baffles, or from an internal wall of the cell via those baffles. The contribution of such indirectly arriving molecules to layer growth is difficult to predict and the proportion of indirectly to directly arriving molecules can be expected to vary significantly with depletion of material in the cell. It is believed that such improvements have been limited to providing instantaneous layer thickness uniformity on the order of about 2%.

There remains a need for further improvement in thickness uniformity of layers deposited in MBE apparatus, as well as a need for an effusion cell which delivers a constant vapor flux independent of the material content of the cell. Improved layer thickness uniformity can increase the number of good devices which are made in a production cycle. Constancy of layer thickness uniformity during a production cycle and from one production cycle to the next can significantly decrease time spent in measuring or calibrating cell flux, thereby shortening production cycles and improving productivity of apparatus.

SUMMARY OF THE INVENTION

Above-described layer thickness uniformity and cell depletion problems are addressed by an effusion cell in accordance with the present invention. The inventive effusion cell is designed for use on MBE apparatus wherein a substrate is held in a planar substrate holder rotated about a rotation axis perpendicular thereto.

In one aspect of the inventive effusion cell, the crucible has a longitudinal axis, a wall, a top, and a base. The effusion cell is configured such that, when attached to the MBE apparatus at a predetermined distance from the substrate holder and offset from the rotation axis of the substrate holder, the crucible's longitudinal axis is directed toward the substrate holder at an angle to the rotation axis of the substrate holder.

The crucible is heatable for melting a material placed therein, the molten material forming a melt surface from which molecules of the material are evaporated. The top of the crucible is configured such that the substrate receives only evaporated molecules which proceed directly from the melt surface thereto. The evaporated molecules received by the substrate are contributed from an area of the melt surface which increases in proportion to the square of the distance of the melt surface from the substrate holder as that distance increases due to depletion of the material in the crucible by evaporation. Because of this, molecular flux on the substrate remains constant during the depletion. Essentially constant, here, meaning within limits determined by manufacturing and measurement accuracy.

In another aspect of the inventive effusion cell, the top of the crucible includes only one elliptical opening. The plane of the opening is inclined towards parallelism with the plane of the substrate holder, the major axis of the elliptical opening is aligned radially with respect to the rotation axis of the substrate holder. In an arrangement wherein the plane of the opening is parallel to the plane of the substrate holder, a layer thickness uniformity on the substrate of better than 0.5% may be realized. The layer thickness uniformity is essentially constant at any contemplated level of material in the crucible.

In one preferred embodiment of the inventive effusion cell, the crucible has a generally frustro-conical form, the top of the crucible is completely open and arranged at an angle to the crucible axis to provide the elliptical opening. The radius of the crucible increasing toward its base in proportion to distance of that radius from the substrate holder. This crucible arrangement has an advantage that at any contemplated level of molten material in the crucible, the melt surface area is no greater than that required to provide direct contribution of molecules to the substrate.

In another preferred embodiment of the inventive effusion cell, the crucible is of a cylindrical form and the opening is formed in a lid of the crucible. The diameter of the crucible is sufficient that at a lowest contemplated level of molten material in the crucible, the exposed melt surface area is of a dimension sufficient to include the contributing surface area for molecules received directly therefrom by the substrate. An embedded conductor or the like may be included in the lid for heating the lid. Heating the lid prevents accumulation of condensed material around the opening therein. This avoids such material contributing to defects in the layer grown on the substrate.

Layer thickness uniformity of about 0.004 (0.4%) over a substrate area about 19.0 cm in diameter is predicted for a cell of 170 cc capacity, at a distance of about 41 cm from the substrate area measured along the centerline of the crucible. Calculations indicate that growth rate at constant temperature changes by only about 0.0005 (0.05%) and uniformity changes by only about 0.001 (0.1%) as fill level of the cell falls from 170 cc to 70 cc. 100 cc of material is sufficient to deposit a total layer thickness of several hundred micrometers ($\mu$m).

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the invention.

DETAILED DESCRIPTION OF THE INVENTION

Figure 1:
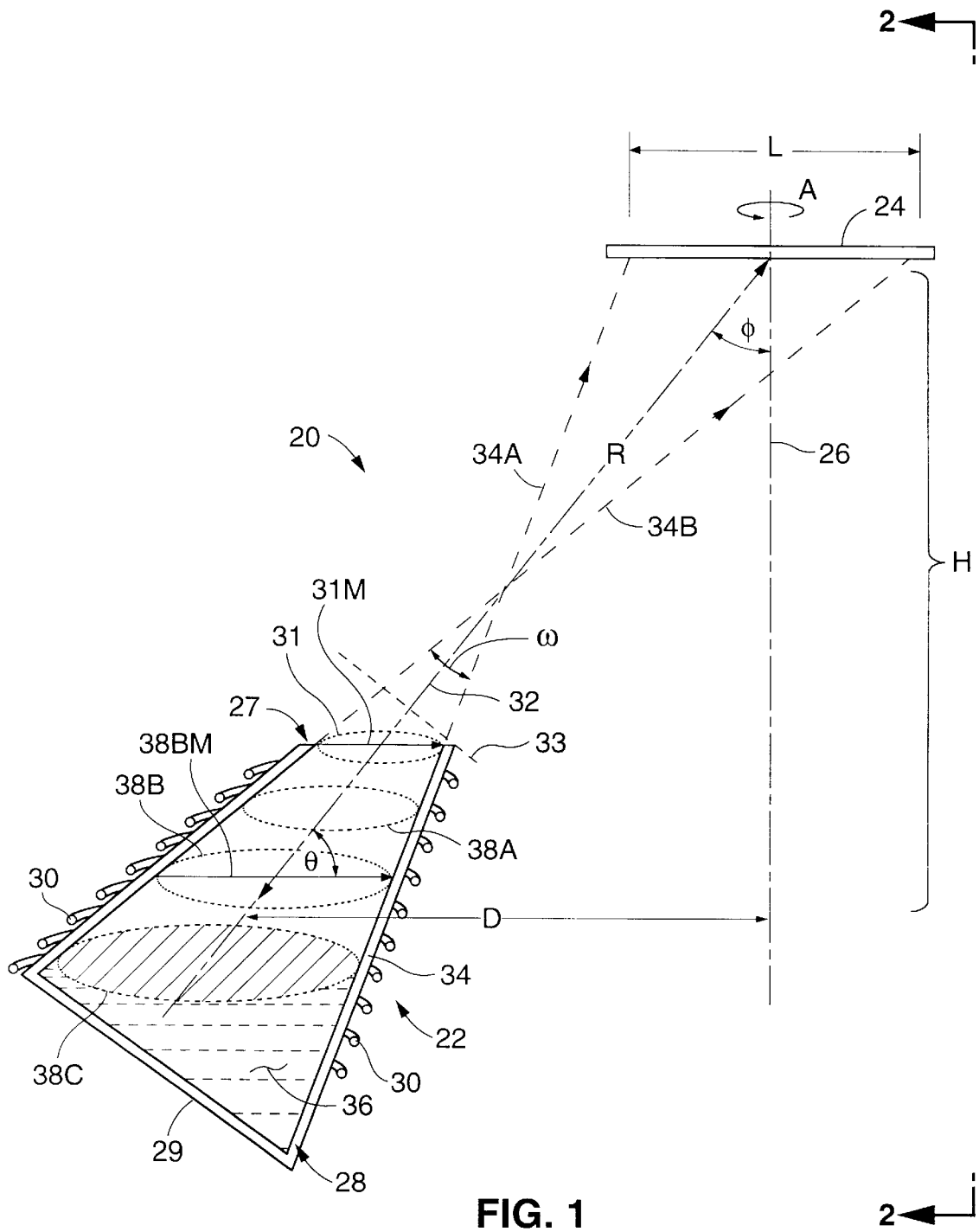
FIG. 1 is an elevation view, partly in cross section, schematically illustrating an arrangement of an effusion cell crucible with respect to a substrate holder in accordance with the present invention.
Figure 2:
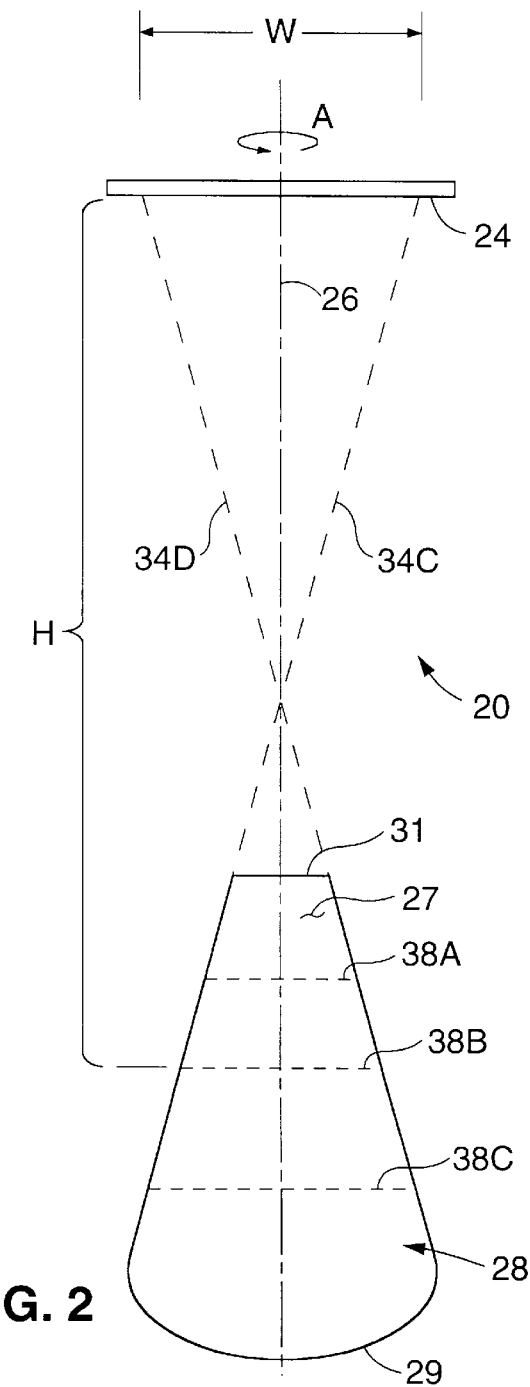
FIG. 2 is another elevation view of the arrangement of FIG. 1 seen generally in the direction 2—2 of FIG. 1.
Figure 3:
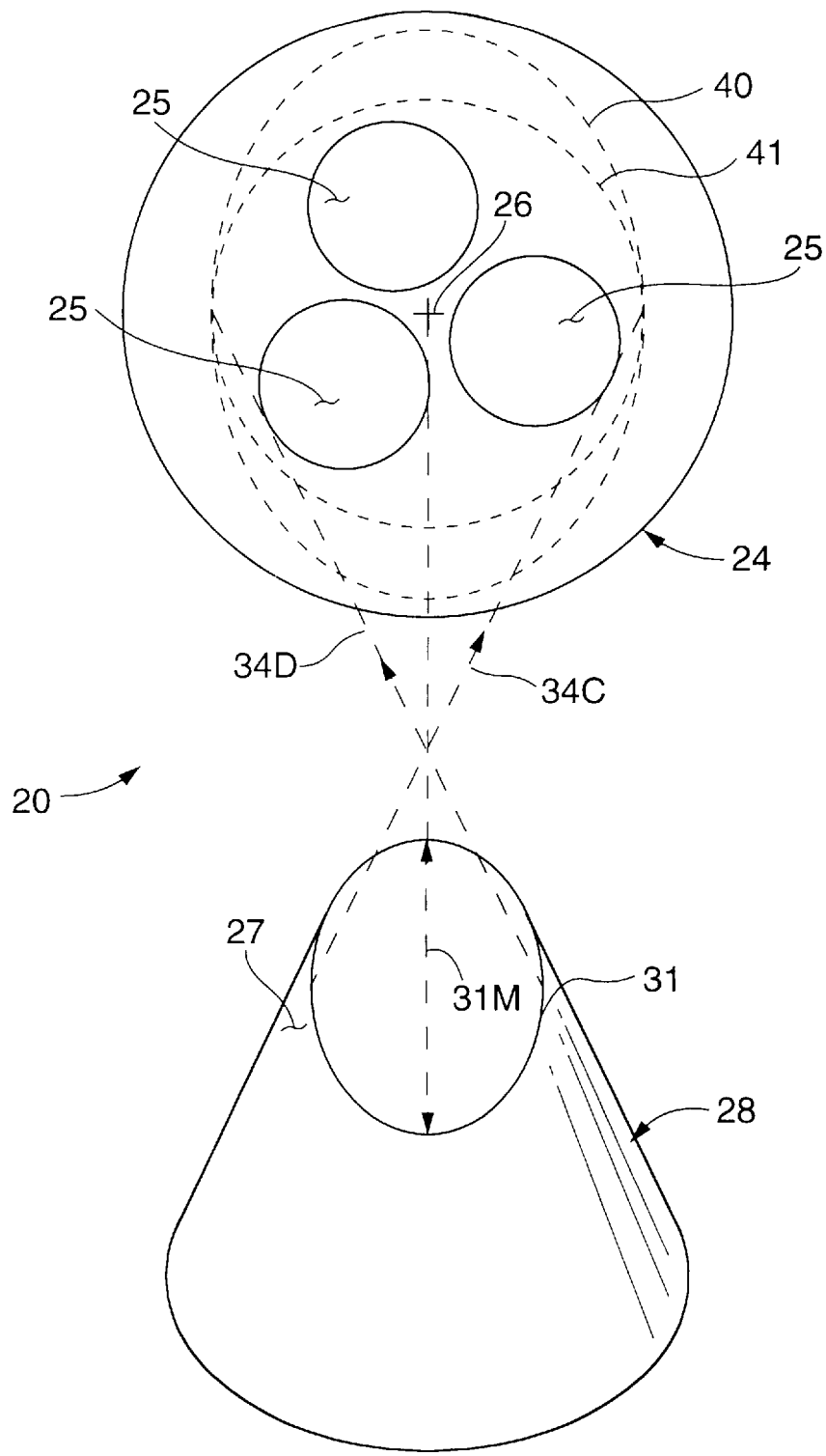
FIG. 3 is a plan view from above schematically illustrating the arrangement of FIG. 1.

Turning now to the drawings, wherein like features are designated by like reference numerals, FIG. 1, FIG. 2 and FIG. 3 schematically illustrate an arrangement 20 of an effusion cell 22 with respect to a planar substrate holder 24 rotating, as indicated by arrow A, about an axis 26 perpendicular to the plane of the substrate holder. Substrate holder 24 is preferably circular and, as is well-known in the art, may hold a single substrate or a plurality of substrates.

Only a crucible 28 and resistance heating coils 30 (shown only in FIG. 1) of effusion cell 22 are illustrated.

Those skilled in the art to which the present invention pertains will be aware that such a cell typically includes an arrangement of heat-reflective baffles for providing a uniform temperature within the cell, water cooling to prevent radiation of heat from the cell, and one or more thermocouples for measuring the temperature of melted material in the cell. The heating arrangement of FIG. 1 is but one example of crucible heating arrangements and should not be considered as limiting the present invention. As such arrangements are well known in the art, and a description of such arrangements is not necessary for understanding principles of the present invention, further description thereof is not presented herein. Similarly the manner in which effusion cells and substrate holders are arranged in MBE apparatus is well known to those skilled in the art and is not necessary for understanding principles of the present invention. Accordingly, a description and depiction of a complete MBE apparatus is not included herein.

Continuing now with reference to FIGS. 1, 2, and 3, crucible 28 is of a generally frustro-conical form and is arranged with a longitudinal axis 32 thereof directed toward substrate holder 24 and oriented at an angle $\phi$ to rotation axis 26 thereof. The term generally frustro-conical, here, is intended to include somewhat irregular sections of a cone-frustrum discussed hereinbelow.

Crucible 28 holds a charge of material 36 to be evaporated. Material 36, when melted, forms an elliptically-shaped melt surface as indicated by dotted ellipse 38A, representing a maximum melted-material level, and by dotted ellipses 38B and 38C representing progressive depletion of the charge through evaporation. It should be noted here that it is not contemplated that material in crucible 28 be allowed to deplete to the extent that base 29 thereof is not completely covered by molten material. In this regard, base 29 of crucible 28 may be alternatively arranged to be parallel to top 27 thereof.

As material is depleted (fill level decreases) in crucible 28, the vertical and horizontal (offset) distances H and D, and, accordingly, the corresponding straight-line distance R, of the melt surfaces from substrate holder 24 will increase.

Top 27 of crucible 28 is arranged to form an elliptical opening indicated by dotted ellipse 31, the plane of this opening is most preferably aligned, as illustrated in FIG. 1, parallel to the plane of substrate holder 24. Preferably also, major axis 31M of opening 31 is aligned radial to rotation axis 26 of substrate holder 24 (see FIG. 3). In this alignment, the major axis of any liquid melt surface area, for example 38BM will also be aligned radial to rotation axis 26. Also, melt surfaces 38 will have the same ellipticity as opening 31. This ellipticity ($\epsilon$) will be equal to:

$$\varepsilon = \frac{1}{\sqrt{\cos^2\theta - \sin^2\theta \tan^2\omega}} \quad (1)$$

where $\theta$ is the angle longitudinal axis 32 to the plane of the melt surface, and $\omega$ is the taper angle of the crucible wall (see FIG. 1). Opening 31 would appear circular if viewed along axis 32.

A projection (represented by dotted lines 34A–D in FIGS. 1, 2, and 3) of tapered wall 34 of crucible 38 defines, on substrate holder 24, an elliptical area 40 having a length L and a width W (see FIG. 3). In the effusion cell arrangement of the present invention, substrates 25 on which layers are to be grown are preferably placed within a circular area 41 on substrate holder 24 of radius W to take into account rotation of the substrate.

Any molecules not proceeding directly from a melt surface 38 of material 36 through opening 31 will impact substrate holder 24 outside of area 41 thereon as the substrate holder is rotated. Area 41 can thus not receive, indirectly, molecules which exit opening 31 following an elastic collision with wall 34 of crucible 28. Here, of course, we refer to the internal surface of wall 34. Similarly any molecule captured on and subsequently re-emitted from wall 38 through opening 31 can not fall within area 41, nor can a solid particle or molecular cluster ejected from the wall by impinging molecules.

It should be noted here that size of substrate holder 24 as depicted in FIGS. 1, 2, and 3 is selected for convenience of description. Those skilled in the art will recognize that, in practice, the substrate holder need be no bigger than the area from which indirectly arriving molecules are precluded.

One reason for precluding impact on a substrate 25 by other than directly delivered molecules is that re-emitted or ejected molecules, particles, or clusters can contribute to defects in a growing layer. By precluding impact from such indirectly arriving species, defect levels in the growing layer can be minimized.

Another important reason for precluding impact on a substrate 25 by other than directly delivered molecules is that, in a mixture of directly and indirectly arriving molecules, the indirectly arriving portion of the mixture would be very difficult to predict. Further, this portion would certainly vary significantly with depletion level, and may also vary randomly at any depletion level.

Figure 1A:
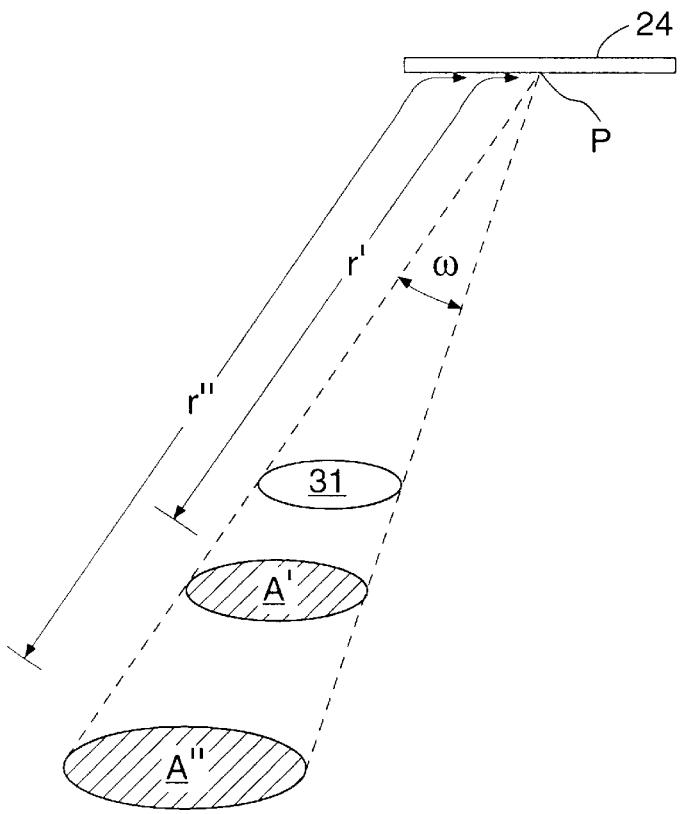
FIG. 1A is a partial perspective view schematically illustrating an arrangement of a opening in the effusion cell crucible of FIG. 1 for providing constant flux at the substrate holder independent of melt level in the crucible.

As described hereinbelow, by precluding arrival of such indirectly arriving molecules, it is possible to accurately predict distribution of arriving molecular flux. Further, by suitably arranging effusion cell 28 and substrate holder 24, flux distribution can be controlled such that a layer can be grown within area 41 with a thickness uniformity better than ±0.5% at any contemplated level of material in crucible 28. This same arrangement can also provide that absolute flux within area 40 of the substrate holder remains constant at any contemplated fill level of material in crucible 28, thereby eliminating the need for constant measurement of flux and adjustment of effusion cell temperature as material in the crucible is depleted by evaporation. This is achieved by providing that the directly contributing melt surface area 38 increases in proportion to the square of increasing distance R of the melt surface from the substrate. This is illustrated graphically in FIG. 1A from which certain physical details of crucible 28 are omitted for clarity. Here, a point P on substrate 24 receives material from a melt area A' at a first level at a distance r' from point P, and from a melt area A" at a second level at a distance r" from point P. Aperture 31 is arranged such that solid angle $\omega$ is related to areas A' and A", and distances r' and r" as follows:

$$\omega \propto \frac{A'}{(r')^2} = \frac{A''}{(r'')^2} \quad (2)$$

Given this relationship, and provided that crucible 28 and aperture 31 are also arranged as described above, such that point P receives material only directly from the melt area, flux remains constant independent of the melt level. Preferably, the wall-taper angle of crucible 28 is made equal to $\omega$ such that the crucible diameter at any depth is just sufficient to include a complete, directly-contributing melt area 38.

Figure 4:
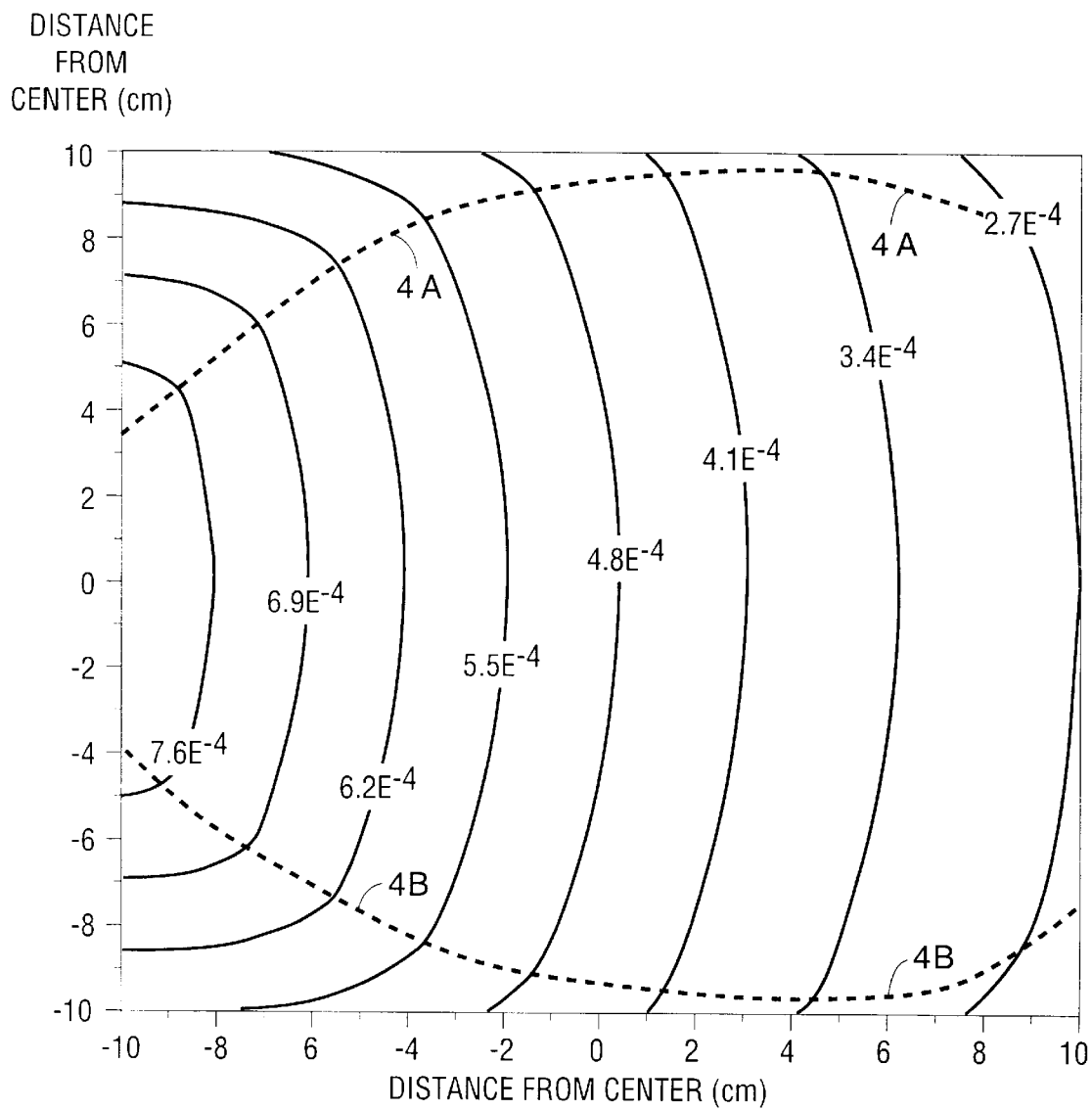
FIG. 4 is a graph schematically illustrating computed flux distribution in the plane of the substrate holder as a function of distance from center in one example of the arrangement of FIG. 1.

Referring now to FIG. 4, the computed molecular flux distribution at the plane of substrate holder 24 is represented graphically by what might be termed "iso-flux" contours, identified by their flux value in arbitrary units. The crucible (not shown) is located offset from center in the negative x-axis direction of the graph. This flux distribution is for the arrangement of FIG. 1 wherein: the wall-taper angle $\omega$ of crucible 28 is 14°; and angle is 36°. Aperture 31 is generally elliptical having a "long diameter" (major axis) of 25.5 mm and a "short diameter" (minor axis) of 20.3 mm, and is located at a distance, measured along the crucible centerline, of 410 mm. These dimensions are typical of an arrangement suitable for a Model V100 MBE apparatus, available from VG SEMICON, of East Grinstead, UK.

It can be seen in FIG. 4 that the iso-flux contours are not entirely in the form of smooth curves, but exhibit an abrupt change of direction as they cross dotted curves 4A and 4B. This abrupt change of direction occurs as the result of a change in the origin of flux from that which is directly received from the melt (between curves 4A and 4B), to a combination of flux directly received from the melt with flux indirectly received from the melt as a result collisions with wall 34 of crucible 38.

Figure 5:
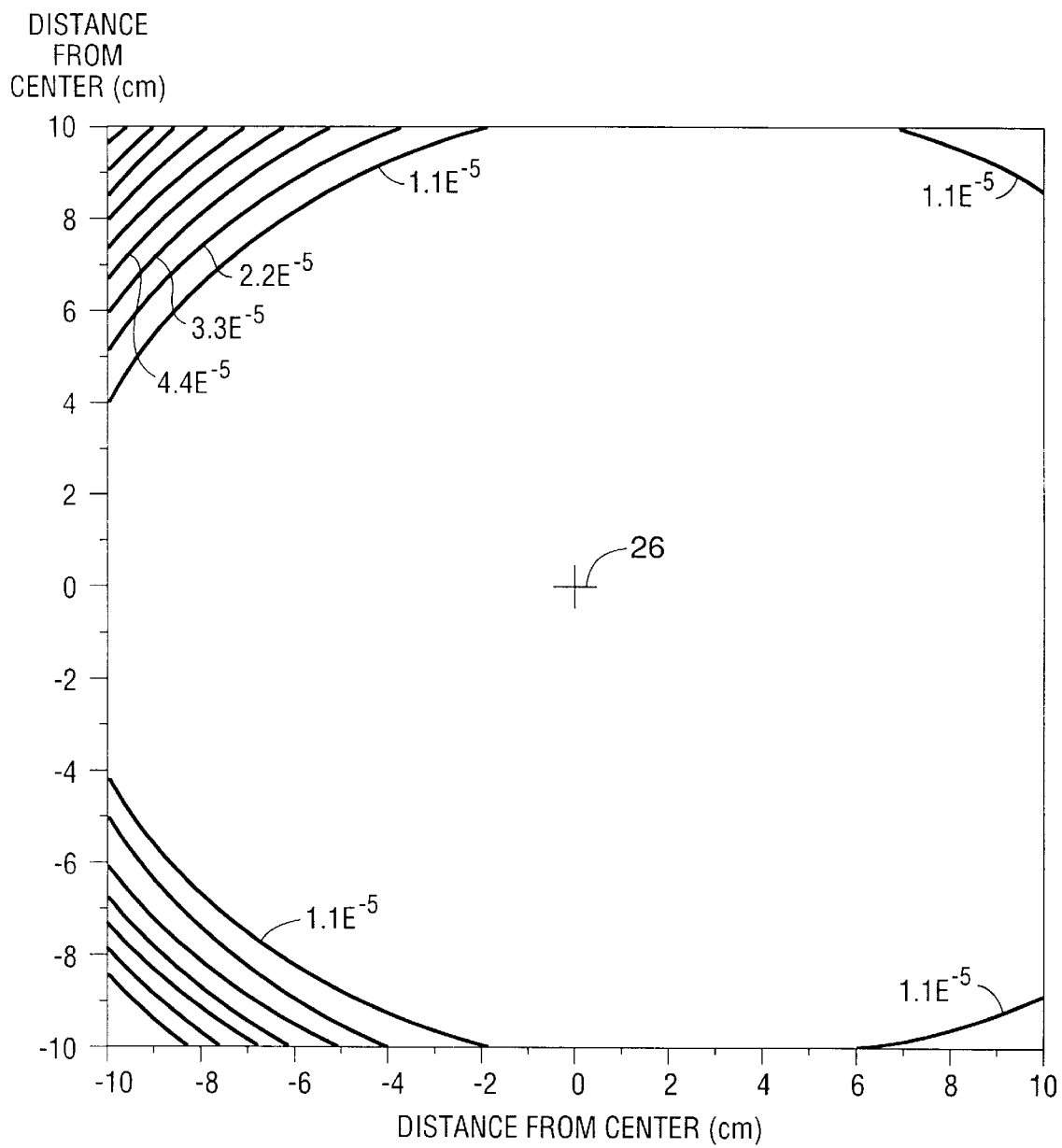
FIG. 5 is a graph schematically illustrating computed flux portion from the crucible in the plane of the substrate holder wall as a function of distance from center in the example of FIG. 4.

In FIG. 5, for comparison, is shown the computed distribution of the indirect (from the crucible) portion of flux in the plane of substrate holder 24. This again is shown in the form of "iso-flux" contours identified by their value in arbitrary units. It can be seen that the lowest value ($1.1E^{-5}$) iso-flux contour corresponds generally in position to lines 4A and 4B of FIG. 4. It can also be seen that there is a circular area (centered about rotation axis 26) having a radius between about 9.0 and 10.0 cm, which receives only "direct" flux from crucible 28. Direct here again meaning only directly from the melt and not indirectly therefrom via the crucible wall. It is this area which is selected for placement of substrates in accordance with principles of the present invention.

Figure 6:
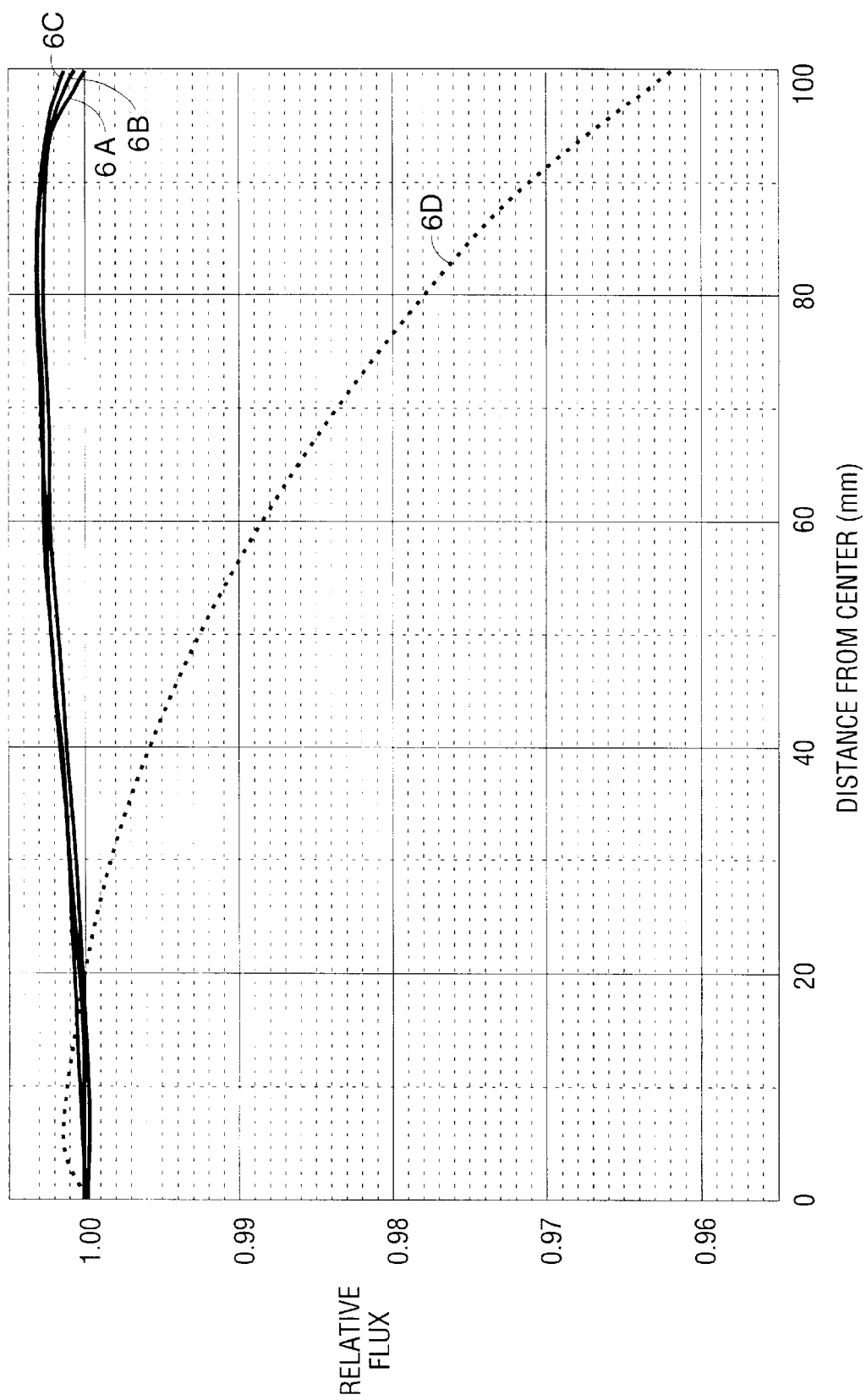
FIG. 6 is a graph schematically illustrating the computed integrated radial distribution of flux as a function of distance from center of a rotating substrate holder in the example of FIG. 4.

Referring now to FIG. 6, the computed, instantaneous, integrated, radial distribution of flux as a function of distance from center of rotating substrate holder 24 is illustrated. This flux distribution, of course, represents the thickness variation of a deposited layer. Three curves 6A, 6B and 6C represent this distribution at three different fill levels of about 170 cc, 130 cc and 70 cc. It can be seen that curves 6A–B fall within a range of variation, one from the other, of only about 0.001. Together, curves 6A–C vary smoothly within about 0.004 out to a distance of about 9.5 cm (95 mm) from center.

By way of comparison, curve 6D of FIG. 6 depicts the layer thickness variation (at 130 cc fill level) which would be achieved with a crucible having dimensions similar to the above discussed example of crucible 28 of FIG. 1, but wherein the crucible opening is a circular opening in a plane illustrated as plane 33 in FIG. 1. It can be seen that the layer thickness variation over the 9.5 cm radius is an order of magnitude greater than for elliptical opening 31.

Further by way of comparison, if a layer thickness variation of 0.5% is taken as a useful upper-limit of allowable layer thickness variation, it can be seen from curves 6A–C that a thickness variation less than this upper limit is available with the effusion cell arrangement of the present invention over an area of substrate holder 24 having a diameter greater than 180 mm. In relative terms, that diameter is greater than about 40% of the cell-to-substrate holder distance measured from aperture 31. This uniformity is available at any contemplated fill level of the crucible. In the arrangement of curve 6D, such a variation is available only in a central area having a diameter less than 80 mm, i.e, less than 20% of the source to substrate distance and less than a 25% of the useful area provided by the effusion cell arrangement of the present invention.

Figure 7:
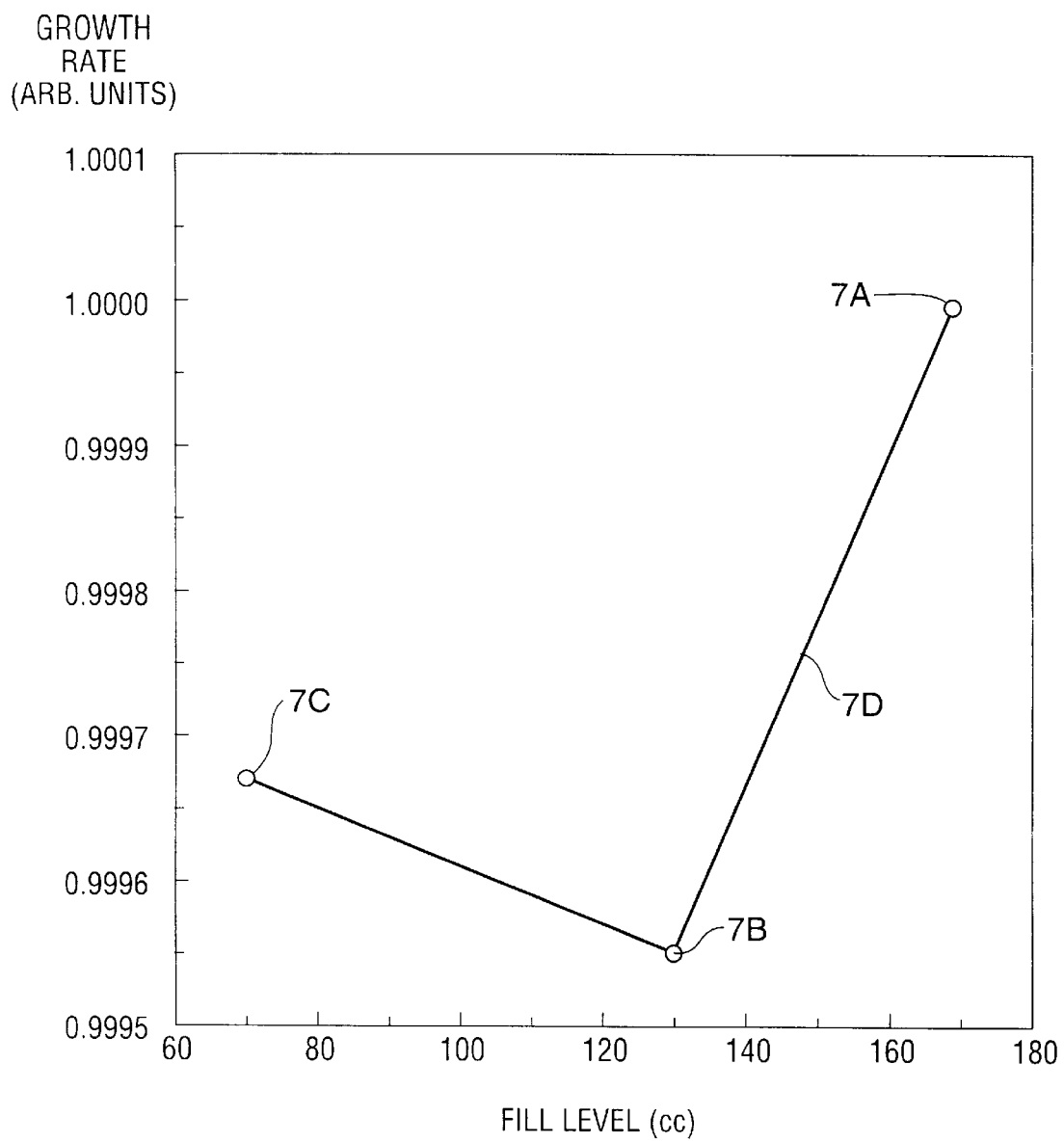
FIG. 7 is a graph schematically illustrating computed relative layer growth rate as a function of crucible fill level in the example of FIG. 4.

Computed rate of layer growth in the plane of substrate holder 21, at the center of the substrate holder, as a function of fill-level in the above-exemplified effusion-cell arrangement of the present invention is schematically illustrated in FIG. 7. Here, rate of growth, assuming a constant melt temperature, has been computed for crucible fill levels of 170.0 cc, 130.0 cc and 70.0 cc (points 7A, B, and C respectively), representing depletion of charge in crucible 28 from an "almost-full" (e.g. level 38A of FIG. 1) level to a minimum contemplated level (e.g. level 38C of FIG. 1). Curve 7D, joining the points, is not intended to represent a mathematical relationship between fill level and growth rate, but is merely added for continuity. In any case, it can be seen from the graph that growth rate variation is only about 0.0005 through the contemplated fill level variation in the crucible. This indicates that an effusion cell/substrate holder arrangement in accordance with the present invention can be used without the constant flux measurement, re-calibration and cell-temperature increase usually necessary with prior-art effusion cells. By way of comparison, in a prior-art effusion cell, the cell temperature typically must be increased up to several tens of degrees over the charge lifetime in order to maintain a constant flux It should be noted here that the graphs of FIGS. 4, 5, 6, and 7 are presented specifically for purposes of illustrating principles of the present invention. Those skilled in the art will recognize from the foregoing description that means for computing contribution of indirectly arriving molecules in this manner are not necessary for practicing those principles. Selection of parameters defining an area on substrate holder 24 which receives only directly arriving molecules, and selection of effusion cell placement with respect to the substrate holder can be made from simple geometric considerations described above. Thereafter, computation of thickness uniformity within area 41 of a rotating substrate holder 24 can be effected, for example, by simply integrating direct molecular contributions at selected receiving points within that (rotating) area from all contributing points, considered as Lambertian radiators, within a selected melt area boundary.

The above-described embodiment 20 of an effusion cell crucible in accordance with the present invention is designed with particular emphasis on providing optimum layer thickness uniformity, and independence of that uniformity to fill level of the crucible. Those familiar with the art, however, will recognize without further explanation, that the preferred frustro-conical shape of the crucible may cause it to be somewhat more difficult to manufacture and incorporate in an effusion cell than would be a conventional cylindrical crucible. Accordingly, arrangements embodying principles of the present invention in effusion cells having cylindrical crucibles are described briefly below.

Figure 8:
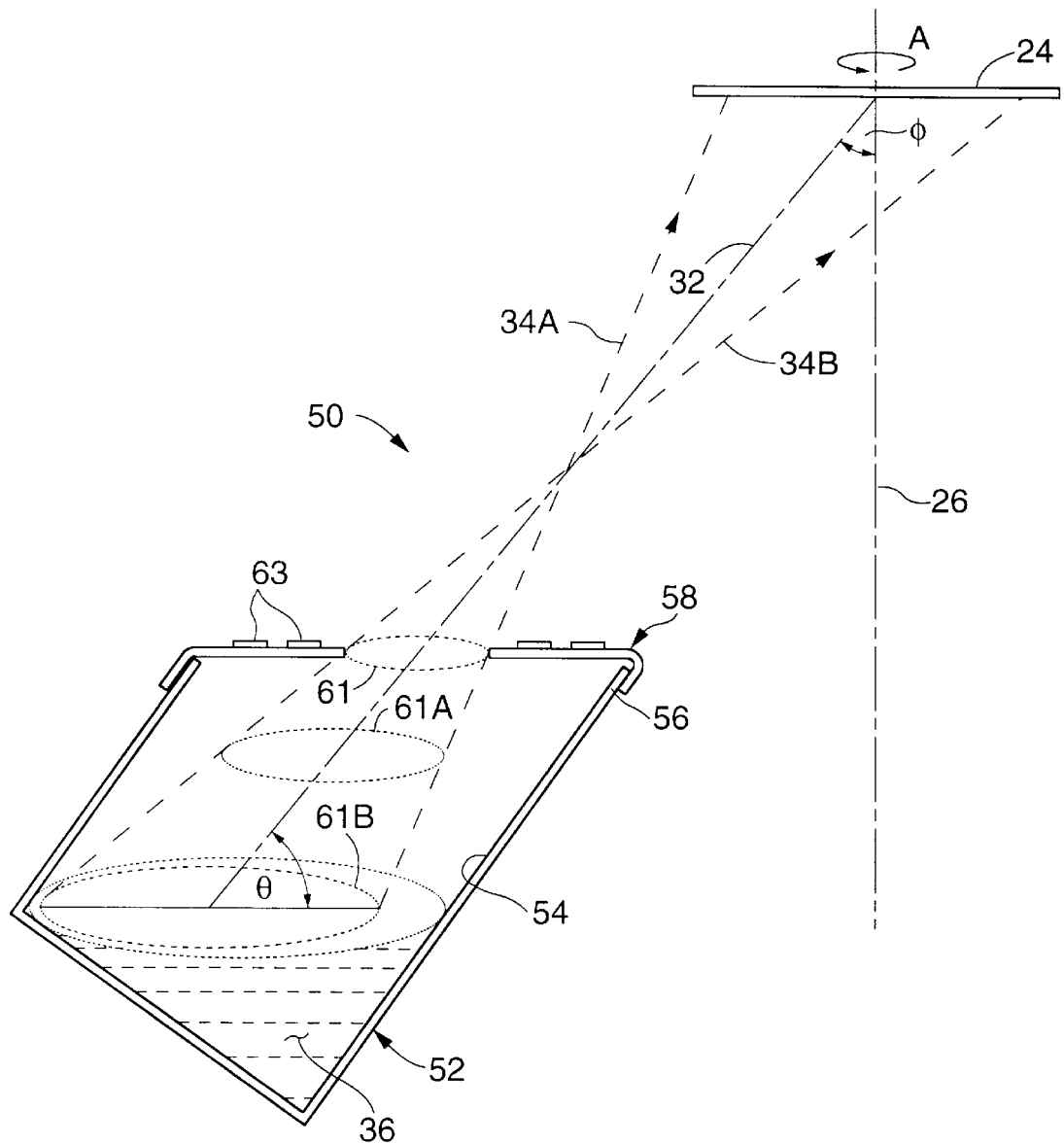
FIG. 8 is an elevation view, partly in cross section, schematically illustrating another arrangement of an effusion cell crucible with respect to a substrate holder in accordance with the present invention.

FIG. 8, depicts an arrangement 50, wherein frustro-conical crucible 28 is replaced with a crucible 52 having a cylindrical wall 54. Description of heating and radiation shielding arrangements for crucible 52 have been omitted. Crucible 52 is arranged such that when longitudinal axis 32 thereof is directed at substrate holder 24 at an angle $\phi$ to rotation axis 26 thereof, top 56 of the crucible is parallel to the plane of substrate holder 24. A lid 58 is placed on crucible 52. Lid 58 has an elliptical aperture therein indicated by dotted ellipse 61. Aperture 61 corresponds to aperture 31 of arrangement 20 in FIG. 1, and is sized to define the same area 41 on substrate holder 24 which, here, does not receive any indirect flux contribution from wall 54 of crucible 52. While an elliptical aperture 61 is preferred for crucible 61, as better simulating opening 31 of crucible 28, use of a circular aperture is not precluded. However, some reduction in uniformity achievable uniformity is possible.

The diameter of crucible 52 should be sufficient to accommodate a complete, directly contributing elliptical melt-surface area (exemplified by dotted ellipses 61A and 61B) at all contemplated fill levels for material 36.

To reduce the possibility of re-emission of molecules from the rim of aperture, 61, lid 58 is preferably heated during evaporation of material. Heating can be accomplished, for example, by passage of current through heating coils or embedded filaments 63, as is known in the art.

Figure 9:
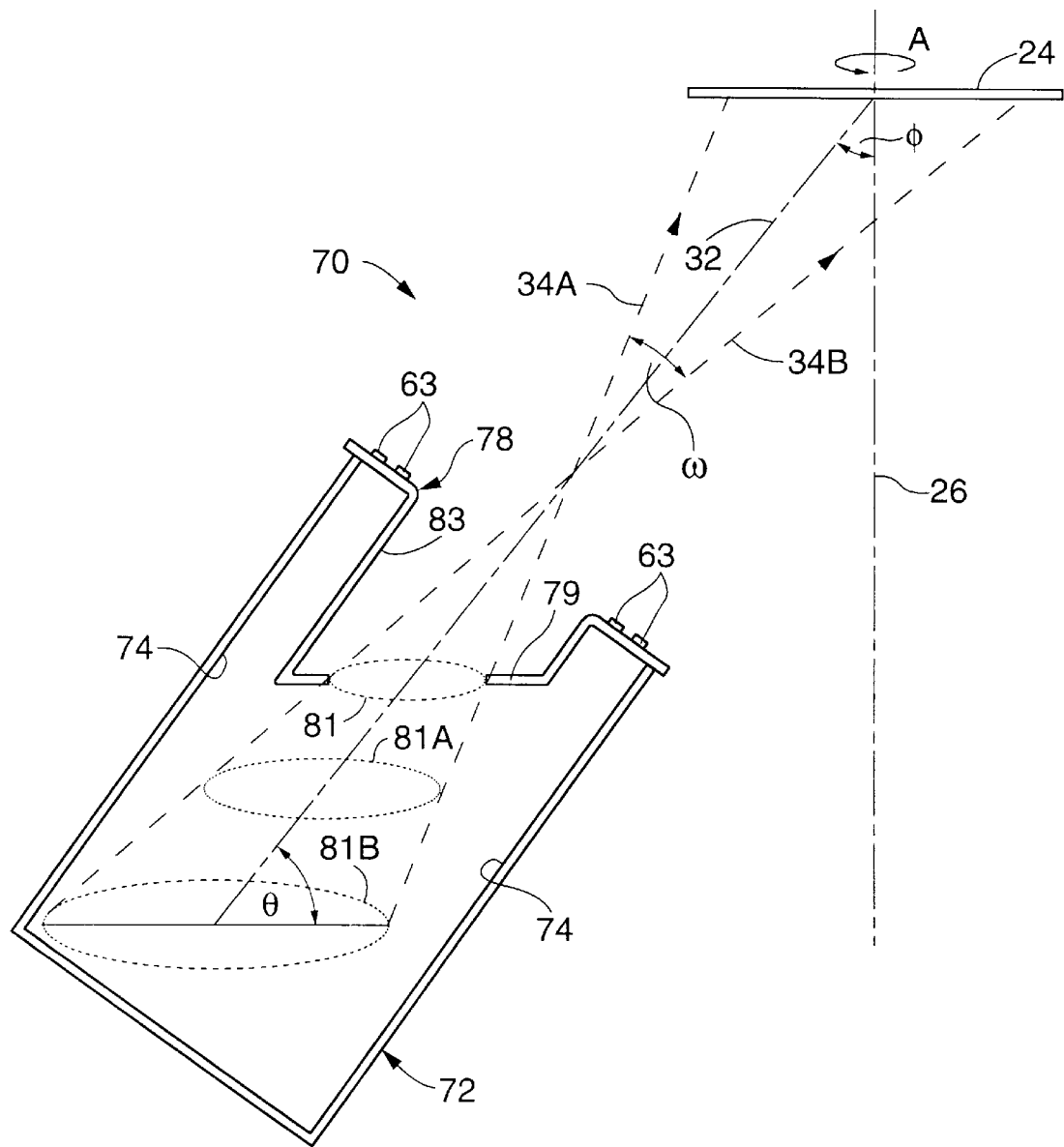
FIG. 9 is an elevation view, partly in cross section, schematically illustrating yet another arrangement of an effusion cell crucible with respect to a substrate holder in accordance with the present invention.

Yet another alternative arrangement of an effusion cell crucible and substrate holder in accordance with the present invention is illustrated in FIG. 9. Here, an arrangement 70 includes a cylindrical crucible 72 having a cylindrical wall 74. Crucible 72 is arranged with longitudinal axis 32 thereof directed at substrate holder 24 at an angle $\phi$ to rotation axis 26 thereof. Again details of crucible heating means and the like have been omitted.

A lid 78 is inserted in top 76 of crucible 72. Insert 78 has a flat-portion 79 arranged parallel to the plane of substrate holder 24. Lid portion 79 has an elliptical aperture therein designated by dotted ellipse 81. Here again a circular aperture is not precluded. Aperture 81 corresponds to aperture 31 of arrangement 20 in FIG. 1, and is similarly specified to define the same area 41 on substrate holder 24 which, here, does not receive any indirect flux contribution from internal wall 74 of crucible 72. It should be noted, however, that in determining the size of aperture 81, consideration must be given to possible flux contributions on substrate holder from collisions or re-emission from the portion 83 of lid 78 exposed above flat portion 79 thereof. Depending on the extent of portion 83 in a specific arrangement, this may result in some reduction in achievable uniformity compared with arrangements 20 or 50.

As in the case of arrangement 50, the diameter of crucible 72 should be sufficient to accommodate a complete, directly-contributing elliptical melt-surface area (exemplified by dotted ellipses 81A and 81B) at all contemplated fill levels for material 36. Lid 78 is preferably heated during evaporation of material. Accordingly heating coils or embedded filaments 63, are provided as described above for lid 50 of crucible 52.

In above-described embodiments of inventive effusion cell and substrate holder arrangements, crucible openings are described as lying in a plane parallel to the plane of substrate holder 24 and being elliptical in shape. While the advantages of this arrangement are evident from results presented graphically in FIGS. 6 and 7, it should not be construed as limiting. Those skilled in the art may devise modified arrangements wherein, by way of example, openings are not exactly elliptical, or of some other shape, or wherein the plane of a crucible opening may be described as being inclined toward parallelism with, rather than being exactly parallel with, the plane of substrate holder 24. It is contemplated that several such modified arrangements are possible without departing from the spirit and scope of the present invention.

The present invention has been described in terms of a preferred and other embodiments. The invention is not limited, however, to the embodiments described and depicted. Rather the invention si defined by the claims appended hereto.

What is claimed is:

1. MBE apparatus, comprising:
    a planar substrate holder for holding a substrate, said substrate holder being rotatable about a rotation axis perpendicular thereto;
    an effusion cell including a crucible having a top and a longitudinal axis, the top of said crucible including only one opening, the effusion cell being arranged with said crucible opening at a predetermined distance from the substrate holder and offset from said rotation axis thereof with the longitudinal axis of the crucible directed toward the substrate holder at an angle to said rotation axis thereof;
    said crucible being heatable for melting a material placed therein, the molten material forming a melt surface from which molecules of the material are evaporated; and
    said opening arranged and dimensions of said crucible arranged such that a predetermined area of the substrate holder receives only evaporated molecules which proceed directly from the melt surface thereto, and such that evaporated molecules received by the predetermined area of said substrate holder are contributed from an area of the melt surface which increases in proportion to the square of the distance of the melt surface from the substrate holder as that distance increases due to depletion of the material in said crucible by evaporation, whereby molecular flux on said predetermined area of the substrate holder remains constant during said depletion.

2. The effusion cell of claim 1, wherein the plane of the opening is about parallel with the plane of the substrate holder.

3. The effusion cell of claim 2, wherein said opening is elliptical and has a major axis thereof aligned radially with respect to the rotation axis of the substrate holder.

4. The effusion cell of claim 2 wherein said opening is circular.

5. The effusion cell of claim 1, wherein said crucible has a generally frustro-conical form, the top thereof being open and providing said opening as an elliptical opening having a major axis arranged radially with respect to the rotation axis of the substrate holder, and the diameter of said crucible increasing with increasing distance from the substrate holder and in direct proportion thereto.

6. The effusion cell of claim 5, wherein the plane of the opening is about parallel to the plane of the substrate holder.

7. The effusion cell of claim 1, wherein said crucible is of a cylindrical form and the opening is formed in a lid of the crucible, the diameter of the crucible being sufficient that at a lowest contemplated level of molten material in the crucible, the exposed melt surface area is of a dimension sufficient to include said contributing surface area for molecules received directly therefrom by said predetermined area of the said substrate holder.

8. The effusion cell of claim 7, wherein the plane of the opening is parallel to the plane of the substrate holder.

9. The effusion cell of claim 8, wherein said opening is elliptical and has a major axis aligned radially with respect to the rotation axis of the substrate holder.

10. The effusion cell of claim 8, wherein said opening is circular.

11. The effusion cell of claim 10, wherein said lid is heatable.

12. MBE apparatus, comprising:
    a plan ar substrate holder for holding a substrate, said substrate holder being rotatable about a rotation axis perpendicular thereto;
    an effusion cell including a crucible having a top and a longitudinal axis, the top of said crucible including only one opening, the effusion cell being arranged with said crucible opening at a predetermined distance from the substrate holder and offset from said rotation axis thereof with the longitudinal axis of the crucible directed toward the substrate holder at an angle to said rotation axis thereof;
    said crucible being heatable for melting a material placed therein, the molten material forming a melt surface from which molecules of the material are evaporated;
    said opening in said crucible being an elliptical opening having a major axis aligned radially with respect to the rotation axis of said substrate holder, the plane of said opening being about parallel to the plane of the substrate holder;
    dimensions of said elliptical opening arranged and dimensions of said crucible arranged such that a predetermined area of the substrate holder receives only evaporated molecules which proceed directly from the melt surface thereto, and such that evaporated molecules received by the said predetermined area of said substrate holder are contributed from an area of the melt surface which increases in proportion to the square of the distance of the melt surface from the substrate holder as that distance increases due to depletion of the material in said crucible by evaporation, whereby molecular flux on said predetermined area of said substrate holder remains constant during said depletion.

13. The effusion cell of claim 12, wherein said crucible has a generally frustro-conical form, the top thereof being open and providing said elliptical opening, and the diameter of said crucible increases with increasing distance from the substrate holder and in direct proportion thereto.

14. The MBE apparatus of claim 12, wherein said crucible is of a cylindrical form and includes a lid at the top thereof, the opening being formed in said lid, and the diameter of the crucible being sufficient that at a lowest contemplated level of molten material in the crucible the exposed melt surface area is of a dimension sufficient to include said contributing surface area for molecules received directly therefrom by said predetermined area of said substrate holder.

15. MBE apparatus, comprising:
    a planar substrate holder for holding a substrate, said substrate holder being rotatable about a rotation axis perpendicular thereto;
    an effusion cell including a cylindrical crucible having a longitudinal axis, an internal wall, and a top, the effusion cell being arranged with the top thereof at a predetermined distance from the substrate holder and offset from said rotational axis thereof with the longitudinal axis of the crucible directed toward the substrate holder at an angle to said rotation axis thereof;

said crucible being heatable for melting a material placed therein, the molten material forming a melt surface from which molecules of the material are evaporated;

a lid inserted in the top of said crucible said lid having a flat portion thereof arranged generally parallel to the plane of said substrate holder, said flat portion including only one opening, said opening being configured such that molecules evaporated from the melt surface can not reach a predetermined area of said substrate holder via said internal wall of the crucible; and said crucible and said opening arranged such that said evaporated molecules received by said predetermined area of said substrate holder are contributed from an area of the melt surface which increases in proportion to the square of the distance of the melt surface from the substrate holder as that distance increases due to depletion of the material in said crucible by evaporation, whereby molecular flux on said predetermined area of the substrate holder remains essentially constant during said depletion.

16. The MBE apparatus of claim 15 wherein said opening is elliptical and has a major axis thereof aligned radially with respect to the rotation axis of said substrate holder.

17. The MBE apparatus of claim 15 wherein said opening is circular.

18. MBE apparatus, comprising:

a planar substrate holder for holding a substrate, said substrate holder being rotatable about a rotation axis perpendicular thereto;

an effusion cell including a crucible having a wall, a top and a longitudinal axis, said effusion cell being arranged with the top thereof at a predetermined distance from the substrate holder and offset from said rotation axis thereof with the longitudinal axis of the crucible directed toward the substrate holder at an angle to said rotation axis thereof;

said crucible being heatable for melting a material placed therein, the molten material forming a melt surface from which molecules of the material are evaporated the top of said crucible including only one opening for allowing passage therethrough of evaporated material to be received by said substrate holder for forming a layer of the material thereon; and the plane of said opening being about parallel with the plane of the substrate holder, the form of said opening, the distance of said opening from said substrate holder, dimensions of the wall of said crucible, and said angle of inclination of the longitudinal axis of said crucible being selected such that, at any contemplated fill level of material in said crucible, the layer of the material formed on said substrate holder has a thickness variation no greater than 0.5% over an area of said substrate holder having a diameter at least about 40% of the distance of said opening from said substrate holder.

19. The MBE apparatus of claim 18, wherein evaporated molecules received by said area of said substrate holder are contributed from an area of the melt surface which increases in proportion to the square of the distance of the melt surface from the substrate holder as that distance increases due to depletion of the material in said crucible by evaporation, whereby molecular flux on said area of said substrate holder remains constant during said depletion.

20. The apparatus of claim 18, wherein said opening is elliptical and has a major axis aligned radially with respect to the rotation axis of said substrate holder.

* * * * *